United States Patent
Koo et al.

(10) Patent No.: US 12,201,040 B2
(45) Date of Patent: Jan. 14, 2025

(54) ELECTRONIC DEVICE INCLUDING PROTON CONDUCTIVE LAYER AND RESISTANCE CHANGE CHANNEL LAYER CAPABLE OF RECEIVING HYDROGEN

(71) Applicant: SK hynix Inc., Icheon-si (KR)

(72) Inventors: Won Tae Koo, Icheon-si (KR); Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 305 days.

(21) Appl. No.: 17/399,437

(22) Filed: Aug. 11, 2021

(65) Prior Publication Data

US 2022/0271221 A1  Aug. 25, 2022

(30) Foreign Application Priority Data

Feb. 22, 2021 (KR) .................. 10-2021-0023707

(51) Int. Cl.
*H10N 70/20* (2023.01)
(52) U.S. Cl.
CPC ......... *H10N 70/253* (2023.02); *H10N 70/245* (2023.02)

(58) Field of Classification Search
CPC ............................................ H10N 70/20–8148
See application file for complete search history.

(56) References Cited

U.S. PATENT DOCUMENTS

| 9,117,771 B2 | 8/2015 | Seifert et al. | |
| 2017/0047513 A1* | 2/2017 | Rolandi | G11C 13/0069 |
| 2022/0209107 A1* | 6/2022 | Onen | H10N 70/883 |

FOREIGN PATENT DOCUMENTS

KR  102123545 B1  6/2020

* cited by examiner

*Primary Examiner* — Laura M Menz
*Assistant Examiner* — Candice Chan

(57) ABSTRACT

An electronic device includes a substrate, a source electrode layer and a drain electrode layer that are disposed to be spaced apart from each other over the substrate, a channel layer that is capable of receiving hydrogen, disposed between the source electrode layer and the drain electrode layer over the substrate, a proton conductive layer disposed on the channel layer, a hydrogen source layer disposed on the proton conductive layer, and a gate electrode layer disposed on the hydrogen source layer.

11 Claims, 8 Drawing Sheets

ELECTRONIC DEVICE INCLUDING PROTON CONDUCTIVE LAYER AND RESISTANCE CHANGE CHANNEL LAYER CAPABLE OF RECEIVING HYDROGEN

CROSS-REFERENCE TO RELATED APPLICATIONS

The present application claims priority under 35 U.S.C. § 119(a) to Korean Application No. 10-2021-0023707, filed on Feb. 22, 2021 in the Korean Intellectual Property Office, which is incorporated herein by reference in its entirety.

BACKGROUND

1. Technical Field

The present disclosure generally relates to an electronic device and, more particularly, to an electronic device including a resistance change channel layer.

2. Related Art

In general, in the field of electronic devices, a resistance-changing material may mean a material that experiences internal electrical resistance changes when an external stimulus such as heat, pressure, voltage, or current is applied. Some of the resistance-changing materials may non-volatilely retain the changed electrical resistance even after the external stimulus is removed. Accordingly, resistive memory devices that use changeable electrical resistance as signal information have emerged. The resistive memory devices may include, for example, a resistance change random access memory (RAM), a phase change RAM, a magnetic change RAM, or the like.

Recently, in relation to the resistive memory devices, various studies are being conducted on methods of increasing the number of resistance states that can be implemented, increasing the size ratio between a plurality of resistance states that can be implemented, increasing linearity and symmetry between a plurality of resistance states to be implemented, and increasing a driving speed of a resistive memory device.

SUMMARY

An electronic device according to an embodiment of the present disclosure includes a substrate, a source electrode layer and a drain electrode layer that are disposed to be spaced apart from each other over the substrate, a channel layer that is capable of receiving hydrogen, disposed between the source electrode layer and the drain electrode layer over the substrate, a proton conductive layer disposed on the channel layer, a hydrogen source layer disposed on the proton conductive layer, and a gate electrode layer disposed on the hydrogen source layer.

An electronic device according to another embodiment of the present disclosure includes a substrate, a source electrode layer and a drain electrode layer that are disposed to be spaced apart from each other over the substrate, a channel layer disposed between the source electrode layer and the drain electrode layer over the substrate, a proton conductive layer disposed on the channel layer, and a gate electrode layer disposed on the proton conductive layer.

DETAILED DESCRIPTION

Figure 1:
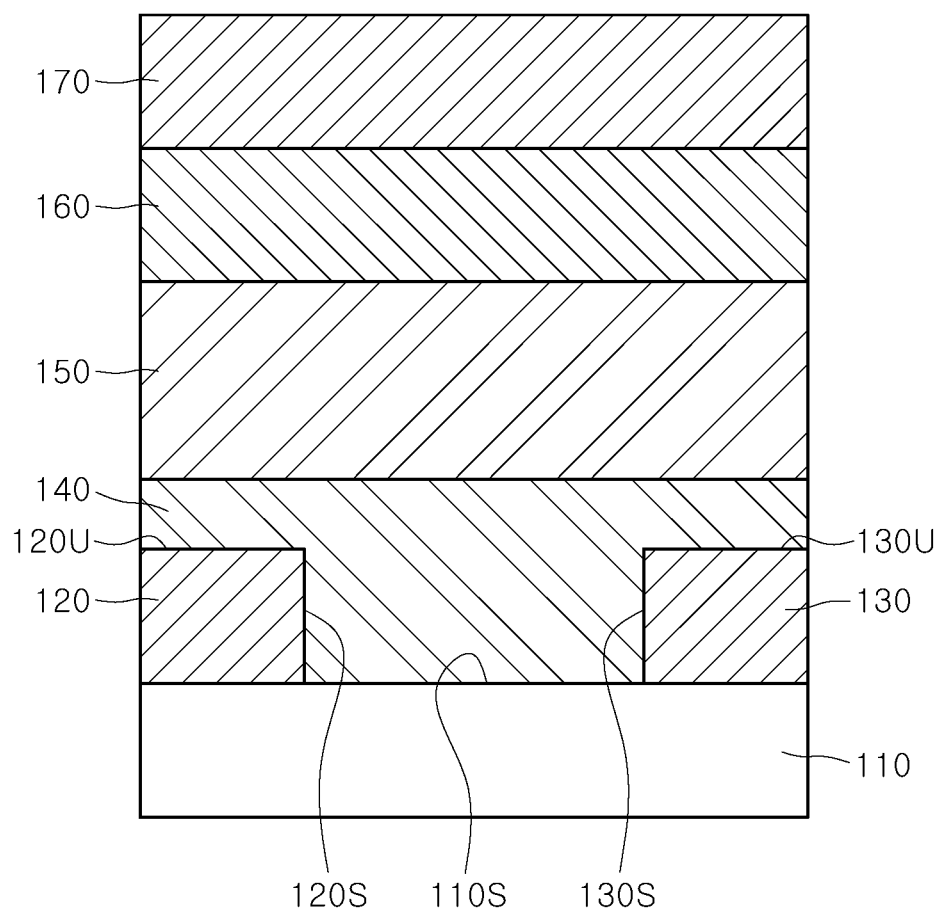
FIG. 1 is a cross-sectional view schematically illustrating an electronic device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as the stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the z-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system.

FIG. 1 is a cross-sectional view schematically illustrating an electronic device according to an embodiment of the present disclosure. Referring to FIG. 1, an electronic device 1 may include a substrate 110, a source electrode layer 120 and a drain electrode layer 130 that are disposed spaced apart from each other on the substrate 110, a channel layer 140 disposed between the source electrode layer 120 and the drain electrode layer 130, a proton conductive layer 150 disposed on the channel layer 140, a hydrogen source layer 160 disposed on the proton conductive layer 150, and a gate electrode layer 170 disposed on the hydrogen source layer 160.

In an embodiment, the substrate 110 may include a semiconductor material. As an example, the substrate 110 may be a silicon (Si) substrate, a gallium arsenide (GaAs) substrate, an indium phosphide (InP) substrate, a germanium (Ge) substrate, or a silicon germanium (SiGe) substrate. The substrate 110 may be doped with an n-type dopant or a p-type dopant to have conductivity. However, the electrical conductivity of the substrate 110 may be substantially lower than that of the channel layer 140. Accordingly, when a voltage is applied between the source electrode layer 120 and the drain electrode layer 130 and a current flows between the source electrode layer 120 and the drain electrode layer 130, the current may selectively flow through the channel layer 140 instead of the substrate 110.

In another embodiment, the substrate 110 may include an insulating material. As an example, the substrate 110 may include a ceramic material or a polymer material. The ceramic material may be, for example, silicon oxide or aluminum oxide. The polymer material may be, for example, polyimide, polyethylene naphthalate (PEN), polycarbonate, or the like.

Referring to FIG. 1, the source electrode layer 120 and the drain electrode layer 130 may be disposed to be spaced apart from each other on a surface 110S of the substrate 110. Each of the source electrode layer 120 and the drain electrode layer 130 may include a conductive material. The conductive material may include, for example, doped semiconductor, metal, conductive metal nitride, conductive metal oxide, conductive metal silicide, conductive metal carbide, or a combination of two or more thereof. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 1, the channel layer 140 may be disposed, between the source electrode layer 120 and the drain electrode layer 130, on the surface 110S of the substrate 110. In an embodiment, the channel layer 140 may be disposed to cover an upper surface 120U and a side surface 120S of the source electrode layer 120 and to cover an upper surface 130U and a side surface 130S of the drain electrode layer 130.

The channel layer 140 may contain hydrogen (H) therein. As an example, the hydrogen (H) may be in a form of an atomic entity or a diatomic entity. In an embodiment, the channel layer 140 may include a metal. Hydrogen (H) may be disposed in an interstitial site of the crystal lattice of the metal. That is, the metal may form a solid solution including hydrogen (H). The channel layer 140 may include metal capable of forming metal hydride by combining with hydrogen (H). In the metal hydride, the metal and the hydrogen (H) may form a metallic bond. The channel layer 140 may include, for example, palladium (Pd), magnesium (Mg), yttrium (Y), or a combination of two or more thereof. As will be described later, the channel layer 140 may exchange hydrogen (H) with the hydrogen source layer 160 through the proton conductive layer 150.

Referring to FIG. 1, the proton conductive layer 150 may be disposed on the channel layer 140. The proton conductive layer 150 may contact the channel layer 140. The proton conductive layer 150 may be disposed to be spaced apart from the source electrode layer 120 and the drain electrode layer 130.

The proton conductive layer 150 may include a solid electrolyte capable of conducting hydrogen (H) in the form of a proton. The proton conductive layer 150 may include proton exchange polymer, metal-organic framework (hereinafter, referred to as "MOF"), covalent-organic framework (hereinafter, referred to as "COF"), sulfonated graphene, polymer-graphene composites, or a combination of two or more thereof.

As an example, the proton exchange polymer may include sulfonated tetrafluoroethylene based fluoropolymer-copolymer, polystyrene-based membranes, sulfonated polyimide (SPI)-based membranes, polyphosphazene-based membranes, polybenzimidazole (PBI)-based membranes, or the like. As another example, the MOF may be sulfonated MOF or polymer-MOF composites. In this case, metal salts capable of forming the MOF may include salts having a formula such as $Zn_4O(CO_2)_6$, $Zn_3O(CO_2)_6$, $Cr_3O(CO_2)_6$, $In_3O(CO_2)_6$, $Ga_3O\ (CO_2)_6$, $Cu_2O(CO_2)_4$, $Zn_2O(CO_2)_4$, $Fe_2O(CO_2)_4$, $Mo_2O(CO_2)_4$, $Cr_2O(CO_2)_4$, $Co_2O(CO_2)_4$, and $Ru_2O(CO_2)_4$. Organic ligands capable of forming the MOF may include oxalic acid, fumaric acid, $H_2BDC$, $H_2BDC$—Br, $H_2BDC$—OH, $H_2BDC$—NO2, $H_2BDC$—$NH_2$, $H_4DOT$, $H_2BDC$—$(Me)_2$, $H_2BDC$—$(Cl)_2$, or the like. As another example, the COF may be sulfonated COF or polymer-COF composites.

Referring to FIG. 1, the hydrogen source layer 160 may be disposed on the proton conductive layer 150. The hydrogen source layer 160 may contain hydrogen (H). As an example, the hydrogen may be in a form of an atomic entity or a diatomic entity. The hydrogen source layer 160 may include, for example, metal hydride or a hydrogen-containing semiconductor. The metal hydride may be, for example, hydride of palladium (Pd), magnesium (Mg), or yttrium (Y). The hydrogen-containing semiconductor may include, for example, silicon (Si) containing hydrogen or gallium arsenide (GaAs) containing hydrogen. When the hydrogen-containing semiconductor is utilized as the hydrogen source layer 160, hydrogen (H) may be injected into the semiconductor material layer in the process of forming the semiconductor material layer. As an example, as a method of injecting hydrogen, a diffusion method or an ion implantation method may be applied.

Referring to FIG. 1, the gate electrode layer 170 may be disposed on the hydrogen source layer 160. The gate electrode layer 170 may include a conductive material. The conductive material may include, for example, doped semiconductor, metal, conductive metal oxide, conductive metal nitride, conductive metal silicide, conductive metal carbide, or a combination of two or more thereof. The conductive material may include, for example, silicon (Si) doped with an n-type or p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, an electronic device according to an embodiment of the disclosure includes a channel layer disposed between a source electrode layer and a drain electrode layer on a substrate. The channel layer is capable of containing hydrogen (H). A proton conductive layer may be disposed on the channel layer, and a hydrogen source layer may be disposed on the proton conductive layer. In addition, a gate electrode layer may be disposed on the hydrogen source layer. In an embodiment, the channel layer may exchange hydrogen (H) with the hydrogen source layer through the proton conductive layer through application of a voltage to the gate electrode layer. After removing the applied voltage, the channel layer may have a hydrogen concentration that varies according to the results of the hydrogen exchange. The channel layer may have different electrical resistances that correspond to the various hydrogen concentrations in the layer. In an electronic device, the channel layer may perform a function of storing, in a non-volatile manner, the different electrical resistances as signal information. That is, the electronic device according to an embodiment of the present disclosure may function as a memory device including the channel layer as a memory layer.

Figure 2A:
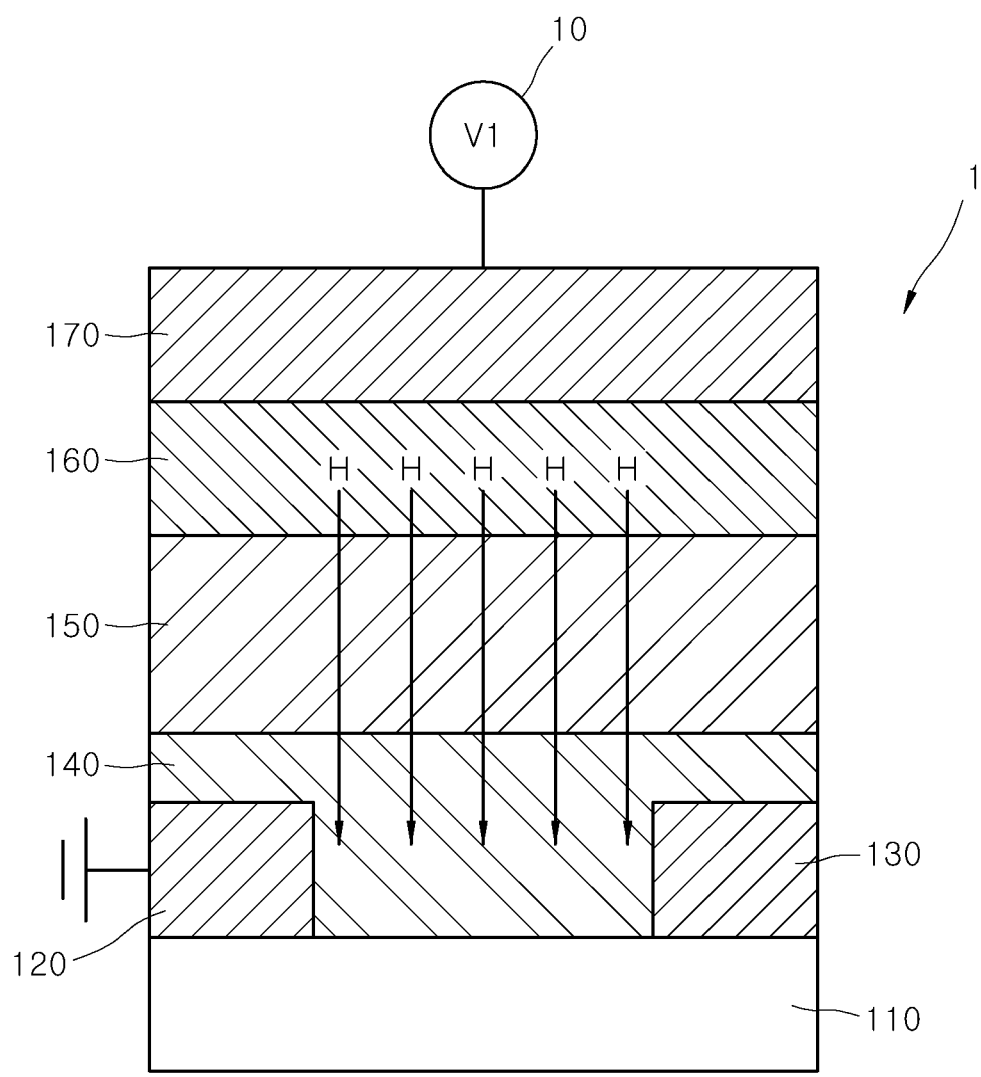
FIGS. 2A and 2B are views schematically illustrating a write operation of an electronic device according to an embodiment of the present disclosure.
Figure 2B:
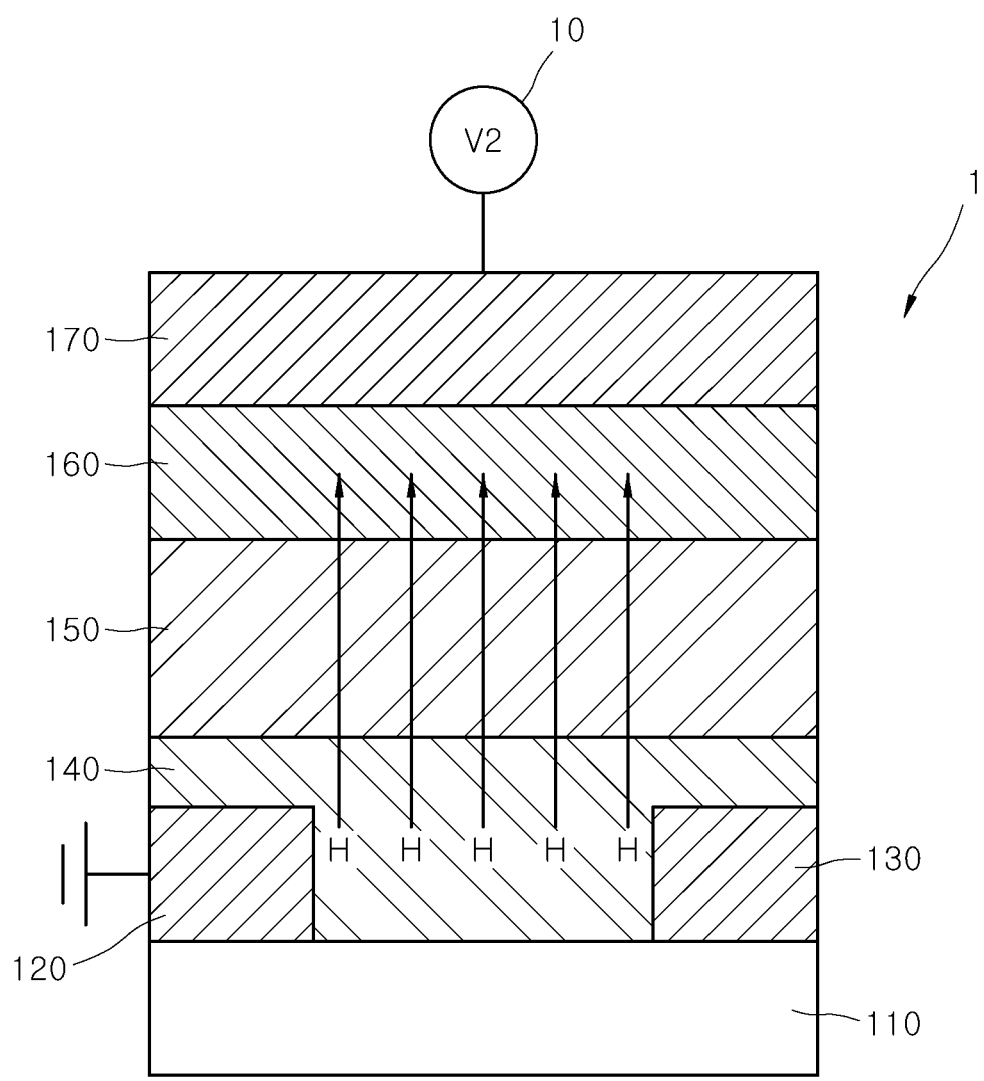
Figure 3:
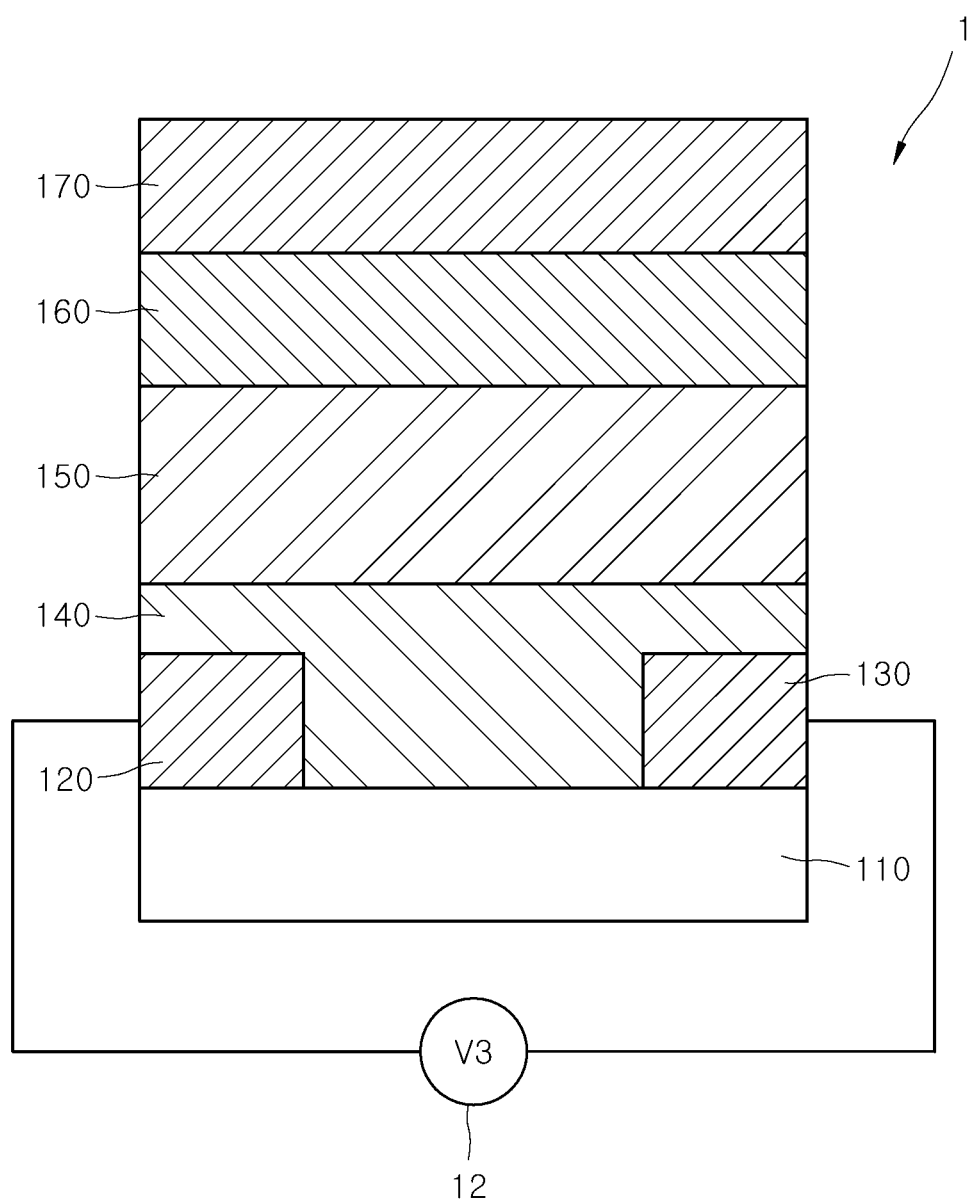
FIG. 3 is a view schematically illustrating a read operation of an electronic device according to an embodiment of the present disclosure.

FIGS. 2A and 2B are views schematically illustrating a write operation of an electronic device according to an embodiment of the present disclosure. FIG. 3 is a view schematically illustrating a read operation of an electronic device according to an embodiment of the present disclosure.

In an embodiment, referring to FIGS. 2A, 2B, and 3, an electronic device according to an embodiment of the present disclosure may operate as a resistance change RAM. FIG. 2A may be a view illustrating a first write operation of writing a high resistance state in a channel layer of the electronic device. FIG. 2B may be a view illustrating a second write operation of writing a low resistance state in the channel layer of the electronic device. FIG. 3 may be a view illustrating a read operation of reading a resistance state written in the channel layer of the electronic device.

Referring to FIG. 2A, a power supply 10 may be connected to the electronic device 1. A first write operation may be performed by applying a first write voltage V1 having a positive bias to a gate electrode layer 170, while a source electrode layer 120 is grounded. In another embodiment, unlike embodiments illustrated by FIG. 2A, a first write operation may be performed by applying the first write voltage V1 having a positive bias to the gate electrode layer 170, while the source electrode layer 120 and a drain electrode layer 130 are both grounded. In yet another embodiment, which is also different from that illustrated in FIG. 2A, when a substrate 110 is a semiconductor substrate having conductivity, a first write operation may be performed by applying the first write voltage V1 having a positive bias to the gate electrode layer 170, while the source electrode layer 120, the drain electrode layer 130, and the substrate 110 are all grounded, and in an example, the electrical conductivity of the substrate 110 may be lower than that of the channel layer 140.

Referring to FIG. 2A, by the first write voltage V1 having a positive polarity, hydrogen (H) inside a hydrogen source layer 160 may move to a channel layer 140 through a proton conductive layer 150. In an embodiment, inside the hydrogen source layer 160, hydrogen (H) may have a form of an atomic entity or a diatomic entity. The hydrogen (H) inside the hydrogen source layer 160 may be converted into a form of a proton by the first write voltage V1, pass through the proton conductive layer 150, and then be conducted to the channel layer 140. The proton conducted to the channel layer 140 may be converted into hydrogen (H) in the channel layer 140 and then the converted hydrogen (H) may be received or integrated in the channel layer 140. For example, the hydrogen (H) may be disposed at an interstitial site inside the crystal lattice of the metal constituting the channel layer 140. In an embodiment, the hydrogen (H) may form a metallic bond with the metal. In another embodiment, the hydrogen (H) may form a metal hydride with the metal.

In some embodiments, the protons converted from the hydrogen (H) inside the hydrogen source layer 160 may react with each other within the layer to generate hydrogen gas. The hydrogen gas generated inside the hydrogen source layer 160 in a region near the interface between the hydrogen source layer 160 and the proton conductive layer 150, as a specific example, may pass through the proton conductive layer 150 and diffuse into the channel layer 140 due to the difference in concentration. The diffused hydrogen gas may decompose into protons by contacting the metal of the channel layer 140. Inside the channel layer 140, the decomposed protons may be converted into the hydrogen (H) and the converted hydrogen (H) may be received and integrated into the channel layer 140.

In an embodiment, the first write voltage may result in a supply of hydrogen (H) to the channel layer 140 in an amount equal to or less than an upper limit of the solubility of hydrogen (H) in the metal of the channel layer 140. In an embodiment, the concentration of hydrogen (H) flowing into the channel layer 140 may be controlled by controlling the magnitude of the positive bias of the first write voltage. In another embodiment, the concentration of hydrogen (H) flowing into the channel layer 140 may be controlled by controlling the time period over which the first write voltage is applied. At this time, the first write voltage maintains constant magnitude of voltage. After the first write voltage is removed, the channel layer 140 may maintain the concentration of hydrogen (H) disposed in the metal. Accordingly, the channel layer 140 may store signal information corresponding to the concentration of the hydrogen (H).

When hydrogen (H) is disposed in the channel layer 140, the electrical resistance of the channel layer 140 may be increased. For example, when the hydrogen (H) is disposed at an interstitial site inside the crystal lattice of the metal, the hydrogen (H) may act as a scattering center for electrons conducting inside the metal. As the concentration of the hydrogen (H) increases, the scattering frequency of the conducting electrons increases, such that the electrical resistance of the channel layer 140 may be increased.

In an embodiment, it is possible to allow the channel layer 140 to have a plurality of different hydrogen concentrations by controlling at least one of the magnitude of the positive bias and the application time of the first write voltage. The channel layer 140 is capable of retaining different hydrogen concentrations, so that after the removal of the first write voltage, the channel layer 140 may non-volatilely store a plurality of pieces of signal information corresponding to different hydrogen concentrations. The plurality of pieces of signal information may correspond to a plurality of electrical resistance states.

Referring to FIG. 2B, the second write operation may be performed by applying a second write voltage V2 having a negative bias to the gate electrode layer 170 while the source electrode layer 120 is grounded. In another embodiment, unlike embodiments illustrated by FIG. 2B, a second write operation may be performed by applying a second write voltage V2 having a negative bias to the gate electrode 170 while the source electrode layer 120 and the drain electrode 130 are grounded together. In yet another embodiment, which is also different from that illustrated in FIG. 2B, when the substrate 110 is a semiconductor substrate having conductivity, a second write operation may be performed by applying a second write voltage V2 having a negative bias to the gate electrode 170 while the source electrode layer 120, the drain electrode 130, and the substrate 110 are grounded together, and in an example, the electrical conductivity of the substrate 110 may be lower than that of the channel layer 140.

Referring to FIG. 2B, by the second write voltage V2 having a negative bias, hydrogen (H) inside the channel layer 140 may move to the hydrogen source layer 160 through the proton conductive layer 150. Hydrogen (H) inside the channel layer 140 may be converted into a form of a proton by the second write voltage V2, pass through the proton conductive layer 150, and then be conducted to the hydrogen source layer 160. The protons conducted to the hydrogen source layer 160 may be converted into hydrogen (H) in the hydrogen source layer 160 and then be accommodated in the hydrogen source layer 160. Inside the hydrogen source layer 160, the hydrogen (H) may have a form of an atomic entity or a diatomic entity.

In some embodiments, hydrogen (H) inside the channel layer 140 converted into a form of a proton by the second write voltage V2 may react with each other to generate hydrogen gas in the channel layer 140. The hydrogen gas generated inside the channel layer 140 in a region near the interface between the channel layer 140 and the proton conductive layer 150, as a specific example, may pass through the proton conductive layer 150 and diffuse into the hydrogen source layer 160 due to the difference in concentrations. The diffused hydrogen gas may be decomposed into protons inside the hydrogen source layer 160. The decomposed protons may be converted into hydrogen (H) inside the hydrogen source layer 160 and then be accommodated in the hydrogen source layer 160.

In an embodiment, the second write voltage may reduce the concentration of hydrogen (H) in the channel layer 140. In an embodiment, the concentration of the hydrogen (H) moving from the channel layer 140 to the hydrogen source layer 160 may be controlled by controlling the magnitude of the negative bias of the second write voltage. In another embodiment, the concentration of the hydrogen (H) moving from the channel layer 140 to the hydrogen source layer 160 may be controlled by controlling the time period over which the second write voltage is applied. After the second write voltage is removed, the channel layer 140 may maintain the concentration of the remaining hydrogen (H). Accordingly, the channel layer 140 may store signal information corresponding to the concentration of the remaining hydrogen (H).

When the concentration of hydrogen (H) inside the channel layer 140 decreases, the electrical resistance of the channel layer 140 may also decrease. As described above, because the hydrogen (H) acts as a scattering center for electrons conducting inside the channel layer 140, as the concentration of hydrogen (H) decreases, the density of the scattering centers may be decreased.

In an embodiment, after performing a second write operation, the concentration of hydrogen (H) inside the channel layer 140 may reach a lower limit. Accordingly, the second write operation may function as a reset operation for removing the hydrogen introduced into the channel layer 140 through the first write operation.

In another embodiment, when performing a second write operation, the channel layer 140 may have a plurality of different hydrogen concentrations obtained by controlling at least one of the magnitude of the negative bias and the amount of time for application of the second write voltage. After the removal of the second write voltage, the channel layer 140 may substantially maintain any of a plurality of different hydrogen concentrations, such that the channel layer 140 is capable of non-volatilely storing a plurality of pieces of signal information corresponding to the plurality of different hydrogen concentrations. The plurality of pieces of signal information may have a plurality of corresponding electrical resistance states. That is, the second write operation may write a plurality of resistance states in the channel layer 140 independently of the first write operation.

Referring to FIG. 3, in order to perform a read operation of the electronic device 1, a power supply 12 may be connected to the source electrode layer 120 and the drain electrode layer 130 of the electronic device 1. The read operation may be performed as a process of applying a read voltage V3 between the source electrode layer 120 and the drain electrode layer 130 to read a current flowing through the channel layer 140.

As described above, the electrical resistance of the channel layer 140 may change according to the hydrogen concentration in the channel layer 140. Accordingly, by reading the electrical resistance of the channel layer 140, it is possible to read the signal information corresponding to the hydrogen concentration written in the channel layer 140.

Figure 4:
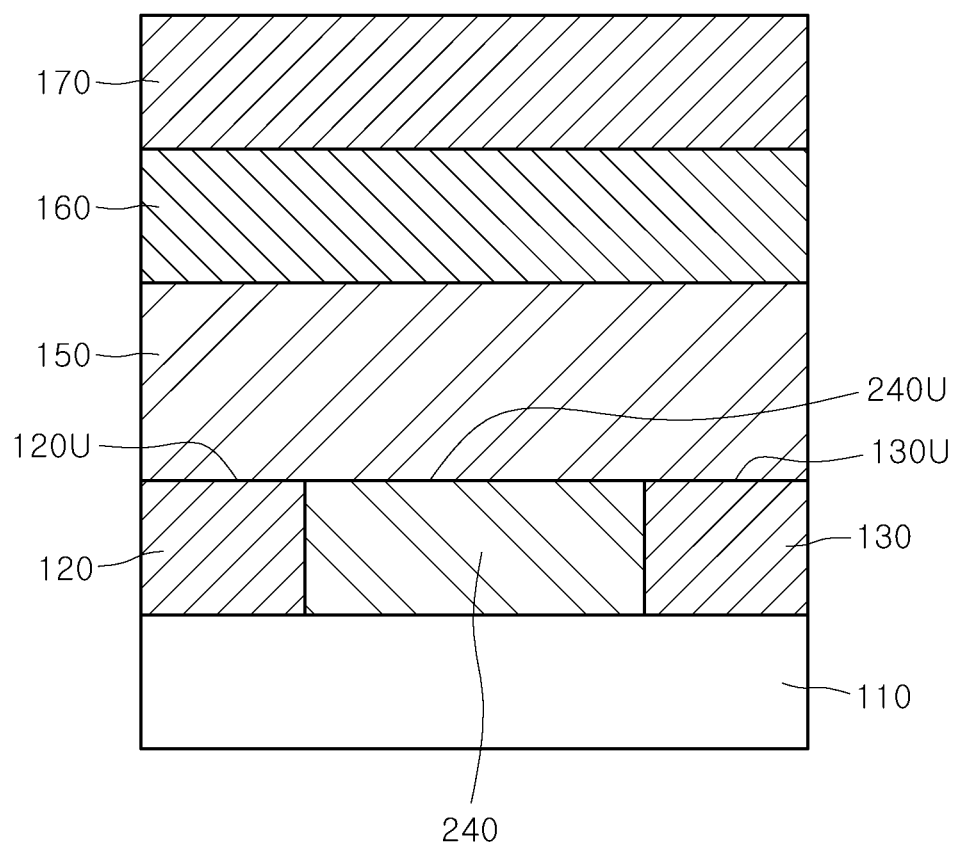
FIG. 4 is a view schematically illustrating an electronic device according to another embodiment of the present disclosure.

FIG. 4 is a view schematically illustrating an electronic device according to another embodiment of the present disclosure. Referring to FIG. 4, an electronic device 2 may have a different configuration in a channel layer 240, compared with the electronic device 1 of FIG. 1. The remaining configuration of the electronic device 2 except for the channel layer 240 may be substantially the same as the configuration of the electronic device 1 of FIG. 1.

Referring to FIG. 4, a source electrode layer 120, the channel layer 240, and a drain electrode layer 130 may be disposed on the same plane on a substrate 110. In addition, an upper surface 120U of the source electrode layer 120, an upper surface 240U of the channel layer 240, and an upper surface 130U of the drain electrode layer 130 may be disposed on the same plane. That is, the upper surface 120U, the upper surface 240U and the upper surface 130U are substantially co-planar. Accordingly, a proton conductive layer 150 may be disposed to contact the source electrode layer 120, the channel layer 240, and the drain electrode layer 130. As a result, compared with the electronic device 1, in the electronic device 2, a thickness of the channel layer 240 may be reduced.

Figure 5:
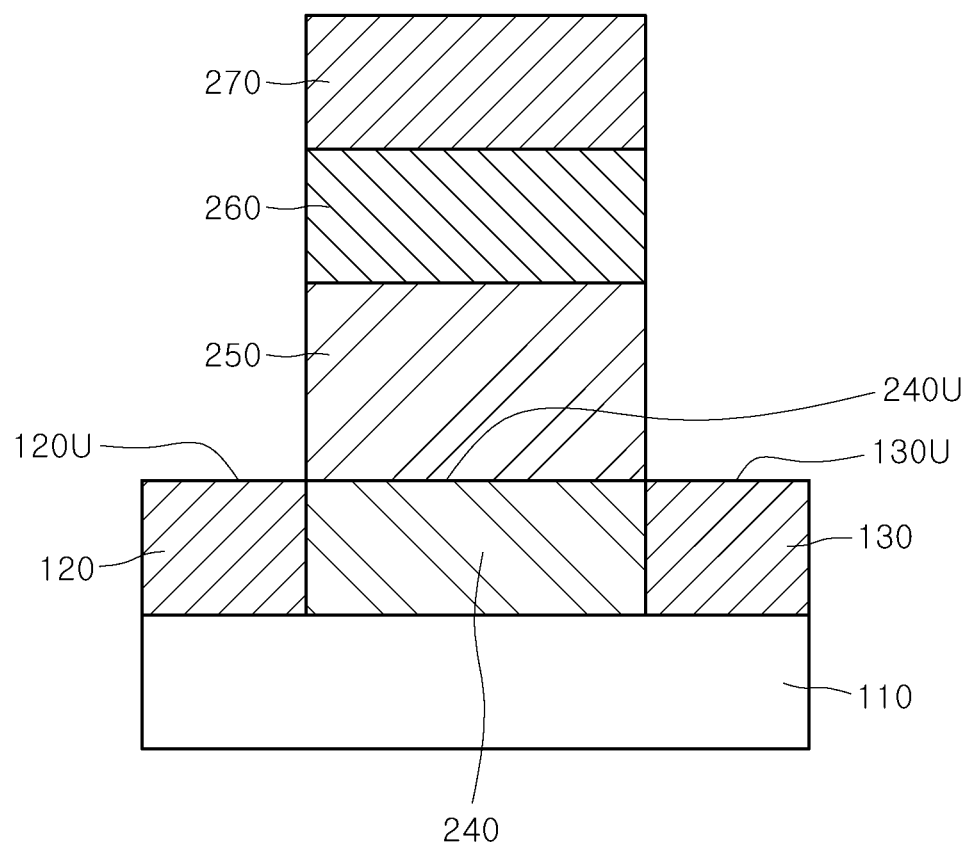
FIG. 5 is a view schematically illustrating an electronic device according to yet another embodiment of the present disclosure.

FIG. 5 is a view schematically illustrating an electronic device according to yet another embodiment of the present disclosure. Referring to FIG. 5, an electronic device 3 may be different from the electronic device 2 of FIG. 4 in the configuration of a proton conductive layer 250, a hydrogen source layer 260, and a gate electrode layer 270. The remaining configuration of the electronic device 3, except for the proton conductive layer 250, the hydrogen source layer 260, and the gate electrode layer 270, may be substantially the same as the configuration of the electronic device 2 of FIG. 4.

Referring to FIG. 5, each of the proton conductive layer 250, the hydrogen source layer 260, and the gate electrode layer 270 may be disposed in the form of a pattern to expose an upper surface 120U of the source electrode layer 120 and an upper surface 130U of the drain electrode layer 130. As an example, as illustrated in FIG. 5, the proton conductive layer 250, the hydrogen source layer 260, and the gate electrode layer 270 may be substantially disposed directly above the channel layer 240. The proton conductive layer 250, the hydrogen source layer 260, and the gate electrode layer 270 are not directly in contact with an upper surface 120U of the source electrode layer 120 and an upper surface 130U of the drain electrode layer 130. Accordingly, it is possible to prevent excessive or undesired movement of the hydrogen (H) from the hydrogen source layer 260 to the source electrode layer 120 or the drain electrode layer 130 via the proton conductive layer 250 during a first write operation for the electronic device 3.

Figure 6:
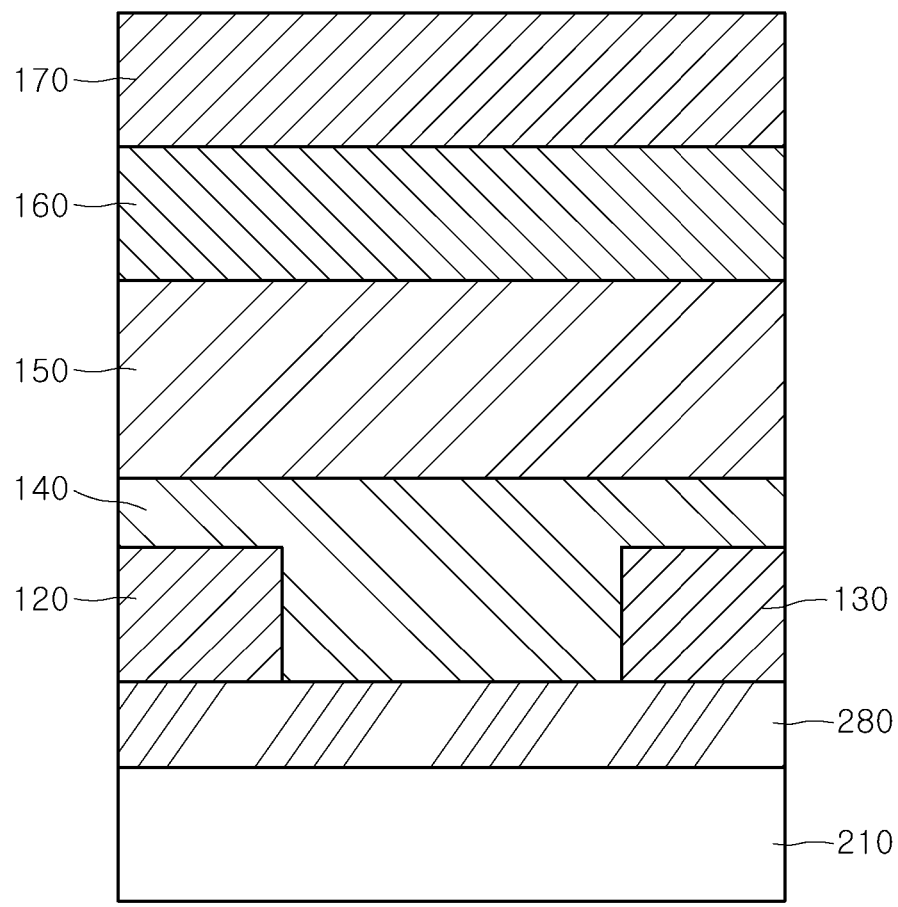
FIG. 6 is a view schematically illustrating an electronic device according to a further embodiment of the present disclosure.

FIG. 6 is a view schematically illustrating an electronic device according to a further embodiment of the present disclosure. An electronic device 4 may further include an insulating layer 280 when compared to the electronic device 1 of FIG. 1.

The insulating layer 280 may effectively insulate a source electrode layer 120, a channel layer 140, and a drain electrode layer 130 from a substrate 210. Accordingly, the substrate 210 of the electronic device 4 may include a conductive material as well as a doped semiconductor material and an insulating material. The conductive material may include, for example, metal, conductive metal nitride, conductive metal oxide, conductive metal carbide, and the like.

In some embodiments, at least one conductive layer and at least one insulating layer may be further disposed between the insulating layer 280 and the substrate 210. The at least one conductive layer and the at least one interlayer insulating layer may include or constitute an integrated circuit.

Figure 7:
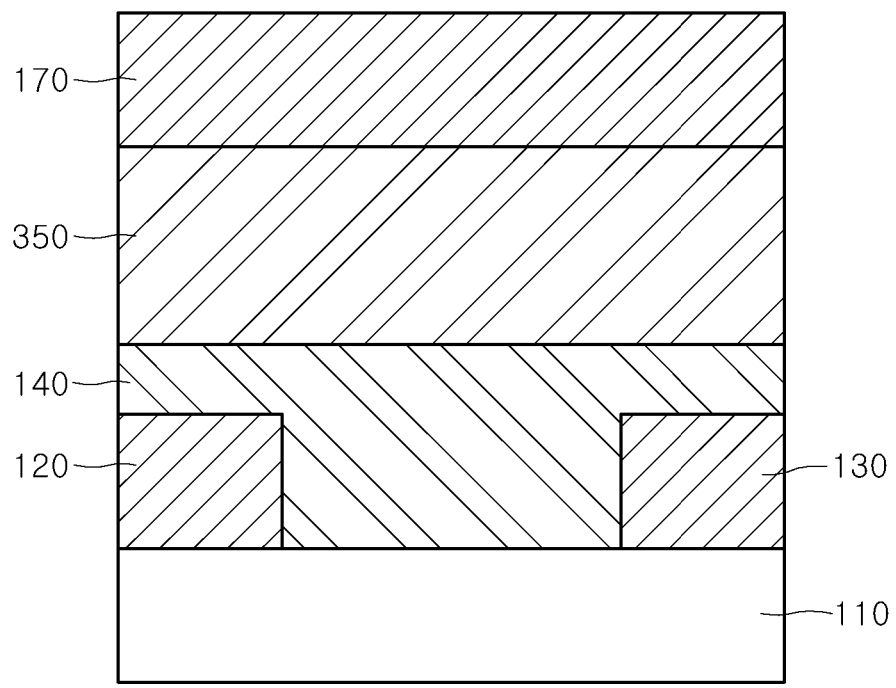
FIG. 7 is a view schematically illustrating an electronic device according to still another embodiment of the present disclosure.

FIG. 7 is a view schematically illustrating an electronic device according to still another embodiment of the present disclosure. Referring to FIG. 7, a hydrogen source layer may be omitted in an electronic device 5 as compared to the electronic device 1 of FIG. 1.

Referring to FIG. 7, a proton conductive layer 350 may be disposed on a channel layer 140, and a gate electrode layer 170 may be directly disposed on the proton conductive layer 350. The proton conductive layer 350 may include hydrogen (H). The hydrogen (H) may be injected into the proton conductive layer 350 when the proton conductive layer 350 is formed on the channel layer 140. A diffusion method or an ion implantation method may be used as the hydrogen injection method. The hydrogen (H) may have, for example, a form of a proton, an atomic entity, or a diatomic entity within the proton conductive layer 350.

In an embodiment, the proton conductive layer 350 may perform the functions of the proton conductive layer 150 and the hydrogen source layer 160 of the electronic device 1 of FIG. 1 together. As an example, when a first write voltage having a positive bias is applied to the gate electrode layer 170 in FIG. 7, hydrogen (H) in the proton conductive layer 350 may be converted into protons. Thereafter, the protons may pass through the proton conductive layer 350 and move to the channel layer 140. The protons moved to the channel layer 140 may be converted into hydrogen (H) in the form of an atomic entity or a diatomic entity, and then be disposed in the metal of the channel layer 140. In another embodiment, when a second write voltage having a negative bias is applied to the gate electrode layer 170 in FIG. 7, the hydrogen (H) inside the channel layer 140 may be converted into protons to move into the proton conductive layer 350. As described above, the protons moved to the proton conductive layer 350 may maintain the form of, for example, a proton, an atomic entity, or a diatomic entity.

As described above, in the electronic device 5, hydrogen (H) may be exchanged between the channel layer 140 and the proton conductive layer 350. According to the different concentrations of hydrogen (H) inside the channel layer 140, different signal information may be stored in the channel layer 140.

In some embodiments not illustrated, the structure of the electronic device 2 related to FIG. 4, the structure of the electronic device 3 related to FIG. 5, or the structure of the electronic device 4 related to FIG. 6 may be utilized in the structure of the electronic device 5 of FIG. 7.

As described above, according to various embodiments of the present disclosure, in electronic devices, hydrogen (H) may be exchanged between a hydrogen source layer (or proton conductive layer) and a channel layer according to a voltage applied to a gate electrode layer. The hydrogen concentration in the channel layer may change as a result of hydrogen exchange. In addition, the electronic device may use a change in the electrical resistance of the channel layer, generated according to a change in the hydrogen concentration, to store signal information.

In an embodiment, the signal information stored in the channel layer may be distinguished according to whether the channel layer is filled with or emptied of the hydrogen (H). In this case, because the mass of hydrogen (H) is small, the rate at which the channel layer is filled with or emptied of the hydrogen (H) may be high. Accordingly, the electronic device according to an embodiment of the present disclosure may have a high driving speed. In addition, through the process of forming a solid solution between the metal and the hydrogen (H), the hydrogen (H) may substantially fill in the metal or the hydrogen (H) may be substantially removed from the metal. Accordingly, the electronic device may obtain a sufficiently high on/off ratio between different signal information corresponding to the hydrogen concentration states. In addition, the channel layer implements an electrical resistance state that increases in proportion to the hydrogen concentration, so that the electronic device may have linear and symmetrical current characteristics proportional to the magnitude of the write voltage.

Meanwhile, in this specification, structures in which a channel layer is disposed so as to be substantially parallel to a surface of a substrate are described in various embodiments, but the present disclosure is not limited thereto. In some embodiments, the technical idea of the present disclosure may be applied to three-dimensional structures in which a channel layer is disposed in a direction substantially perpendicular to a surface of a substrate. Accordingly, in some embodiments, a source electrode layer and a drain electrode layer may be disposed to be spaced apart in a first direction substantially perpendicular to a surface of the substrate. In addition, a proton conductive layer, a hydrogen source layer, and a gate electrode layer may be disposed adjacent to the channel layer extending in the first direction.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. An electronic device comprising:
    a substrate;
    a source electrode layer and a drain electrode layer that are disposed to be spaced apart from each other over the substrate;
    a channel layer that is capable of receiving hydrogen, disposed between the source electrode layer and the drain electrode layer over the substrate;

a proton conductive layer disposed on the channel layer;
a hydrogen source layer disposed on the proton conductive layer; and
a gate electrode layer disposed on the hydrogen source layer,
an upper surface of the source electrode layer, an interface between the channel layer and the proton conductive layer, and an upper surface of the drain electrode layer are located at the same level from the substrate,
wherein the proton conductive layer is disposed to contact the source electrode layer, the channel layer, and the drain electrode layer directly.

2. The electronic device of claim 1, wherein the source electrode layer and the drain electrode layer are disposed on the same plane.

3. The electronic device of claim 1, wherein the proton conductive layer is disposed to be spaced apart from the source electrode layer and the drain electrode layer.

4. The electronic device of claim 1, wherein the channel layer includes a metal and wherein the hydrogen is disposed in an interstitial site of a crystal lattice of the metal.

5. The electronic device of claim 1, wherein the channel layer includes a metal that forms a metal hydride.

6. The electronic device of claim 1, wherein the channel layer includes at least one of palladium (Pd), magnesium (Mg), and yttrium (Y).

7. The electronic device of claim 1, wherein the proton conductive layer includes at least one selected from the group consisting of proton exchange polymer, metal-organic framework (MOF), covalent-organic framework (COF), sulfonated graphene, and polymer-graphene composites.

8. The electronic device of claim 1, wherein the hydrogen source layer includes a metal hydride or a hydrogen-containing semiconductor.

9. The electronic device of claim 1, wherein the channel layer has a hydrogen concentration that varies with a voltage applied to the gate electrode layer.

10. The electronic device of claim 1, wherein the channel layer has an electrical resistance that varies according to the concentration of the received hydrogen.

11. The electronic device of claim 10, wherein the channel layer has an electrical resistance that increases as the concentration of the received hydrogen increases.

* * * * *